(12) United States Patent
Hosokawa et al.

(10) Patent No.: US 10,090,047 B2
(45) Date of Patent: Oct. 2, 2018

(54) MEMORY CELL STRUCTURE

(71) Applicant: INTERNATIONAL BUSINESS MACHINES CORPORATION, Armonk, NY (US)

(72) Inventors: Kohji Hosokawa, Kawasaki (JP); Masatoshi Ishii, Kawasaki (JP); Takeo Yasuda, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/346,841

(22) Filed: Nov. 9, 2016

(65) Prior Publication Data

US 2018/0130528 A1 May 10, 2018

(51) Int. Cl.
  *G11C 7/16* (2006.01)
  *G11C 13/00* (2006.01)
  *G11C 11/4096* (2006.01)

(52) U.S. Cl.
  CPC ...... *G11C 13/0069* (2013.01); *G11C 11/4096* (2013.01); *G11C 13/004* (2013.01)

(58) Field of Classification Search
  CPC . G11C 7/16; G11C 27/00–27/04; G11C 11/54
  See application file for complete search history.

(56) References Cited

U.S. PATENT DOCUMENTS

| | | | |
|---|---|---|---|
| 4,999,525 A | 3/1991 | Park et al. | |
| 5,790,461 A | 8/1998 | Holst | |
| 8,001,065 B2 | 8/2011 | Tanaka et al. | |
| 8,812,414 B2 | 8/2014 | Arthur et al. | |
| 8,892,487 B2* | 11/2014 | Chang | G06N 3/063 706/27 |
| 8,964,475 B2 | 2/2015 | Lee | |
| 2014/0310220 A1 | 10/2014 | Chang et al. | |
| 2015/0039547 A1* | 2/2015 | Kang | G06N 3/049 706/42 |

(Continued)

OTHER PUBLICATIONS

New Memristor-Based Crossbar Array Architecture with 50% Area Reduction and 48% Power Savings for Matrix-Vector Multiplication of Analog Neuromorphic Computing, Journal of Semicondcutor Technology and Science Jun. 2014.*

(Continued)

*Primary Examiner* — Hien Nguyen
(74) *Attorney, Agent, or Firm* — Tutunjian & Bitetto, P.C.; Vazken Alexanian

(57) ABSTRACT

A memory cell structure includes a synapse memory cell including plural cell components, each of the plural cell components including a unit cell, plural write lines arranged for writing a synapse state to the synapse memory cell, each of the plural write lines being used for writing one of a first set of a predetermined number of states to a corresponding cell component by writing one of a second set of the predetermined number of states to the unit cell included in the corresponding cell component, the first set depending on the second set and a number of the unit cell included in the corresponding cell component, and a read line arranged for reading the synapse state from the synapse memory cell, the read line being used for reading one of the first set of the predetermined number of states from all of the plural cell components simultaneously.

18 Claims, 6 Drawing Sheets

(56) References Cited

U.S. PATENT DOCUMENTS

2016/0125287 A1    5/2016  Pantazi et al.

OTHER PUBLICATIONS

Li, et al. "Spiking-based Matrix Computation by Leveraging Memristor Crossbar Array" Computational Intelligence for Security and Defense Applications (CISDA), May 2015, 4 pages.
Rothenbuhler, et al. "Reconfigurable Threshold Logic Gates using Memristive Devices" Journal of Low Power Electronics and Applications, vol. 3, No. 2: Feb. 2013, pp. 174-193.
ISR issued in International Application No. PCT/IB2017/056618 dated Feb. 7, 2018, pp. 1-9.

* cited by examiner

MEMORY CELL STRUCTURE

BACKGROUND

Technical Field

The present invention relates to a memory cell structure.

Related Art

Recently, various techniques have been known regarding a memory cell structure.

SUMMARY

According to an embodiment of the present invention, a memory cell structure is provided. The memory cell structure includes a synapse memory cell which includes a plurality of cell components. Each of the plurality of cell components includes at least one unit cell. The memory cell structure further includes a plurality of write lines are arranged for writing a synapse state to the synapse memory cell. Each of the plurality of write lines is configured to write one of a first set of a predetermined number of states to a corresponding cell component of the plurality of cell components by writing one of a second set of the predetermined number of states to all of the at least one unit cell included in the corresponding cell component. The first set depends on the second set and a number of the at least one unit cell included in the corresponding cell component. The memory cell structure further includes a read line arranged for reading the synapse state from the synapse memory cell. The read line is configured to read one of the first set of the predetermined number of states from all of the plurality of cell components simultaneously.

According to another embodiment of the present invention, a memory cell system is provided. The memory cell system includes a synapse memory cell which includes a plurality of cell components. Each of the plurality of cell components includes at least one unit cell. The memory cell system further includes a plurality of write drivers configured to write a synapse state to the synapse memory cell. Each of the plurality of write drivers operates to write one of a first set of a predetermined number of states to a corresponding cell component of the plurality of cell components by writing one of a second set of the predetermined number of states to all of the at least one unit cell included in the corresponding cell component. The first set depends on the second set and a number of the at least one unit cell included in the corresponding cell component. The memory cell system further includes a read driver configured to read the synapse state from the synapse memory cell. The read driver is configured to read one of the first set of the predetermined number of states from all of the plurality of cell components simultaneously.

According to yet another embodiment of the present invention, a method for fabricating a memory cell structure is provided. The method includes preparing a plurality of unit cells. The method includes composing a plurality of cell components each including at least one unit cell of the plurality of unit cells. The method includes composing a synapse memory cell which includes the plurality of cell components. The method further includes arranging a plurality of write lines for writing a synapse state to the synapse memory cell. Each of the plurality of write lines is configured to write one of a first set of a predetermined number of states to a corresponding cell component of the plurality of cell components by writing one of a second set of the predetermined number of states to all of the at least one unit cell included in the corresponding cell component. The first set depends on the second set and a number of the at least one unit cell included in the corresponding cell component. The method further includes arranging a read line for reading the synapse state from the synapse memory cell. The read line is configured to read one of the first set of the predetermined number of states from all of the plurality of cell components simultaneously.

DETAILED DESCRIPTION

Hereinafter, exemplary embodiments of the present invention will be described in detail with reference to the attached drawings.

It is to be noted that the present invention is not limited to these exemplary embodiments given below and may be implemented with various modifications within the scope of the present invention. In addition, the drawings used herein are for purposes of illustration, and may not show actual dimensions.

Figure 1:
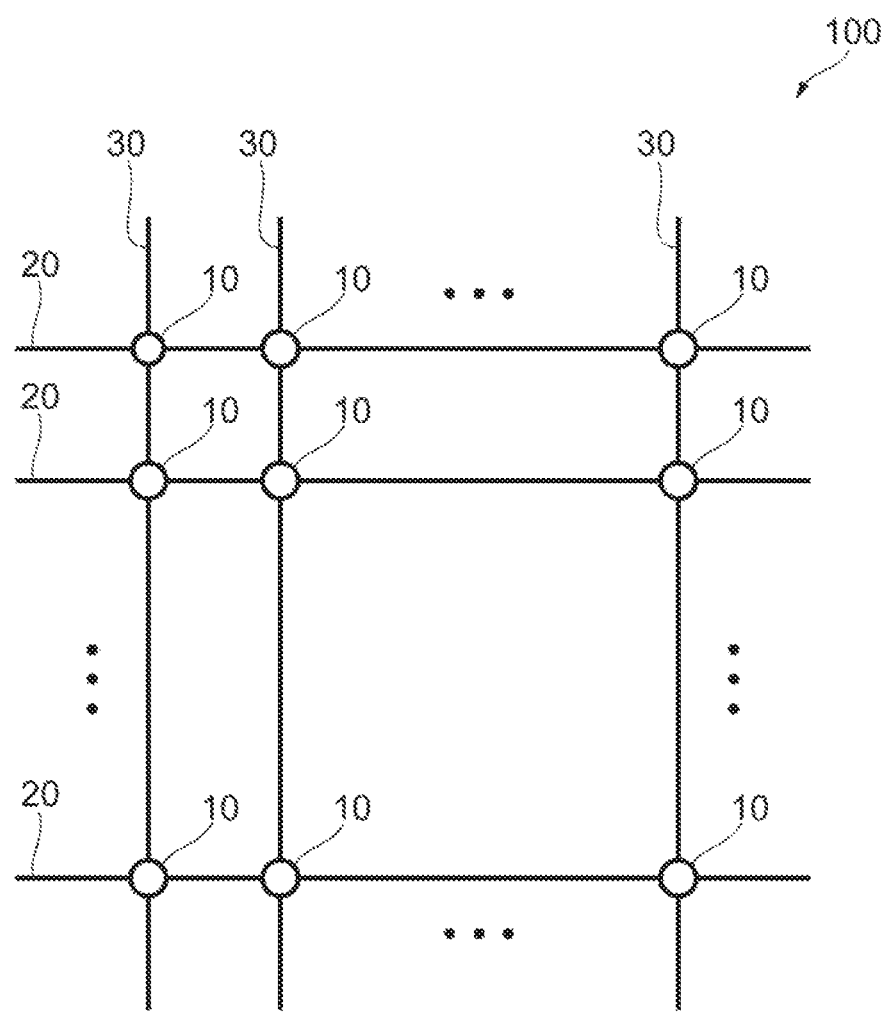
FIG. 1 depicts a synapse memory having a cross-bar array structure, according to an embodiment of the present invention.

Hardware implementation of a neuromorphic system may include synapse memories as well as neuron bodies and axon connection networks. Referring to FIG. 1, a synapse memory 100 having a cross-bar array structure is shown. As shown in FIG. 1, the synapse memory 100 may include synapse memory cells 10 arranged/placed at all cross points of all axons 20 and all dendrites 30. Each of the synapse memory cells 10 may store a synapse weight value as one example of a synapse state, which indicates a weight of a synapse connection between a corresponding one of the axons 20 and a corresponding one of the dendrites 30.

A synapse memory cell 10 is categorized into two types, namely an analog synapse memory cell (e.g., an analog cell) and a digital synapse memory cell (e.g., a digital cell).

The analog cell can express a continuous synapse weight value. However, it is hard to control the synapse weight value with a certain level of accuracy. It also requires complicated peripheral circuits to control the synapse weight value within such level of accuracy. Further, variation of performance of the synapse memory cell 10 affects performance of the neuromorphic system directly.

The digital cell can be further categorized into a Single-Level Cell (SLC) and a Multi-Level Cell (MLC).

The SLC uses a single threshold level to discriminate two states (e.g., a heavy state and a light state). The SLC can only express a state with or without a connection between pre-synapse and post-synapse. Thus, the SLC mostly requires other memories to express more than two synapse weight values. Consequently, access to multiple memories is required.

The MLC uses multiple threshold levels. Assuming that the number of the threshold levels is n (>1), the MLC can express (n+1) synapse weight values. For example, if n is seven, eight synapse weight values can be stored in one MLC. The MLC can express a more accurate synapse weight value than the SLC. However, it is hard to control the synapse weight value as well as the above analog cell. Further, the MLC requires high resolution sensing circuits and complicated encoding/decoding circuits to read and write the synapse weight value.

The synapse memory cell 10 is more convenient and precisely controlled if these drawbacks are overcome.

The synapse memory cell 10 with a simple structure described below is more accurate than the MLC. This synapse memory cell 10 requires neither high resolution sensing circuits nor complicated encoding/decoding circuits.

Referring to FIGS. 2A to 2D, cell components of a synapse memory cell 10 according to an exemplary embodiment are shown. In an exemplary embodiment, the synapse memory cell 10 is assumed to be a resistive memory cell which includes a plurality of unit resistances. Each of the plurality of unit resistances is assumed to have a weight value $W_{unit}$, which may be a conductance value (e.g., an inverse of a resistance value $R_{unit}$). In an exemplary embodiment, each of the plurality of unit resistances is assumed to be implemented with the SLC stated above. That is, the weight value $W_{unit}$ is assumed to have two states, namely a heavy state and a light state. For example, the weight value $W_{unit}$ may be one (1) when it has a heavy state, and zero (0) when it has a light state.

In an embodiment, cell components each consisting of $2^{i-1}$ unit resistances may be prepared, where i is 1 to n. If i is not 1, the $2^{i-1}$ unit resistances may be connected in parallel. Thus, the cell component consisting of the $2^{i-1}$ unit resistances may have a weight value expressed with $2^{i-1}$ times of $W_{unit}$ (a resistance value expressed with one $2^{i-1}$th ($\frac{1}{2}^{i-1}$) of $R_{unit}$). That is, the cell component consisting of the $2^{i-1}$ unit resistances may have a weight value "0" or "$2^{i-1}$".

Figure 2A:
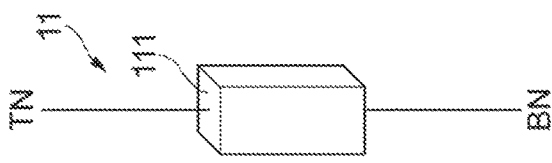
FIG. 2A, depicts cell components of a synapse memory cell according to an exemplary embodiment.

For example, FIG. 2A shows a cell component 11, which is a cell component for i=1. The cell component 11 may include one unit resistance 111. Thus, the cell component 11 may have a weight value expressed with $W_{unit}$. That is, the cell component 11 may have a weight value "0" or "1". The weight values "0" and "1" serve as one example of a first set of a predetermined number of states. For the single cell component for i=1, the weight values "0" and "1" also serve as one example of a second set of a predetermined number of states. Further, FIG. 2A shows a top node (TN) and a bottom node (BN) of the cell component 11.

Figure 2B:
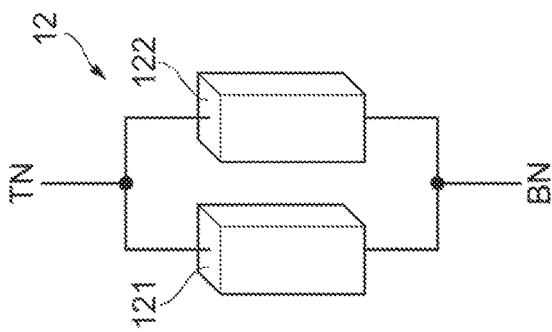
FIG. 2B depicts cell components of a synapse memory cell according to an exemplary embodiment.

FIG. 2B shows a cell component 12, which is a cell component for i=2. The cell component 12 may include unit resistances 121 and 122 connected in parallel. Thus, the cell component 12 may have a weight value expressed with twice of $W_{unit}$ (a resistance value expressed with a half ($\frac{1}{2}$) of $R_{unit}$). That is, the cell component 12 may have a weight value "0" or "2". The weight values "0" and "2" serve as one example of a first set of a predetermined number of states. Further, FIG. 2B shows a TN formed by connecting top nodes of the unit resistances 121 and 122, and a BN formed by connecting bottom nodes of the unit resistances 121 and 122.

Figure 2C:
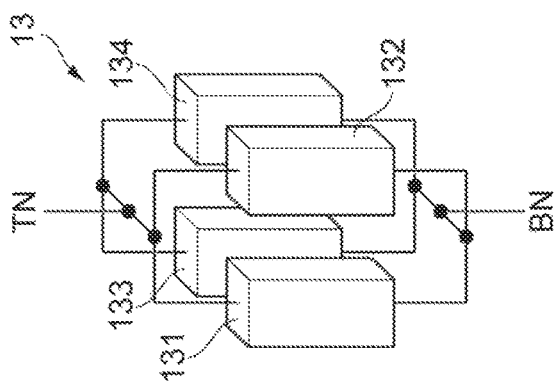
FIG. 2C depicts cell components of a synapse memory cell according to an exemplary embodiment.

FIG. 2C shows a cell component 13, which is a cell component for i=3. The cell component 13 may include unit resistances 131 to 134 connected in parallel. Thus, the cell component 13 may have a weight value expressed with four times of $W_{unit}$ (a resistance value expressed with a quarter ($\frac{1}{4}$) of $R_{unit}$). That is, the cell component 13 may have a weight value "0" or "4". The weight values "0" and "4" serve as one example of a first set of a predetermined number of states. Further, FIG. 2C shows a TN formed by connecting top nodes of the unit resistances 131 to 134, and a BN formed by connecting bottom nodes of the unit resistances 131 to 134.

Figure 2D:
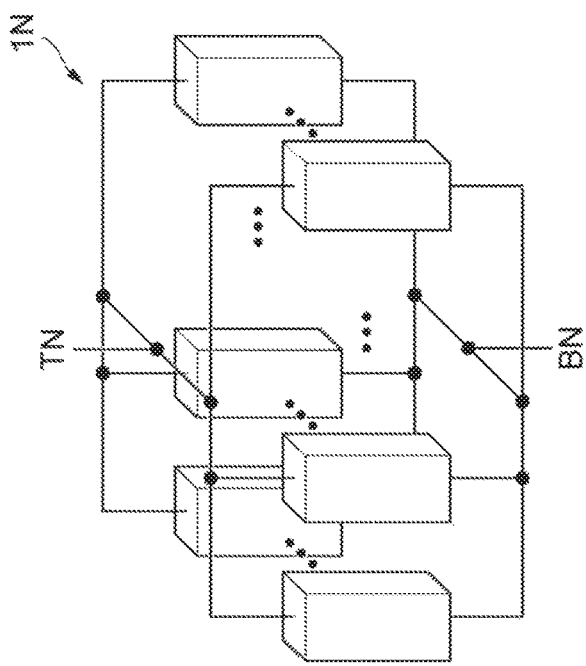
FIG. 2D depicts cell components of a synapse memory cell according to an exemplary embodiment.

Similarly, cell components for i=4 to i=n−1 may be formed. Now referring to FIG. 2D, FIG. 2D shows a cell component 1N, which is a cell component for i=n. The cell component 1N may include $2^{n-1}$ unit resistances connected in parallel. Thus, the cell component 1N may have a weight value expressed with $2^{n-1}$ times of $W_{unit}$ (a resistance value expressed with one $2^{n-1}$th ($\frac{1}{2}^{n-1}$) of $R_{unit}$). That is, the cell component 1N may have a weight value "0" or "$2^{n-1}$". The weight values "0" and "$2^{n-1}$" serve as one example of a first set of a predetermined number of states. Further, FIG. 2D shows a TN formed by connecting top nodes of the $2^{n-1}$ unit resistances, and a BN formed by connecting bottom nodes of the $2^{n-1}$ unit resistances. By combining these cell components for i=1 to i=3, for example, the synapse weight values "0" to "7" can be expressed. That is, with these cell components for i=1 to i=n, the synapse weight values for n-digit binary numbers can be expressed.

Figure 3:
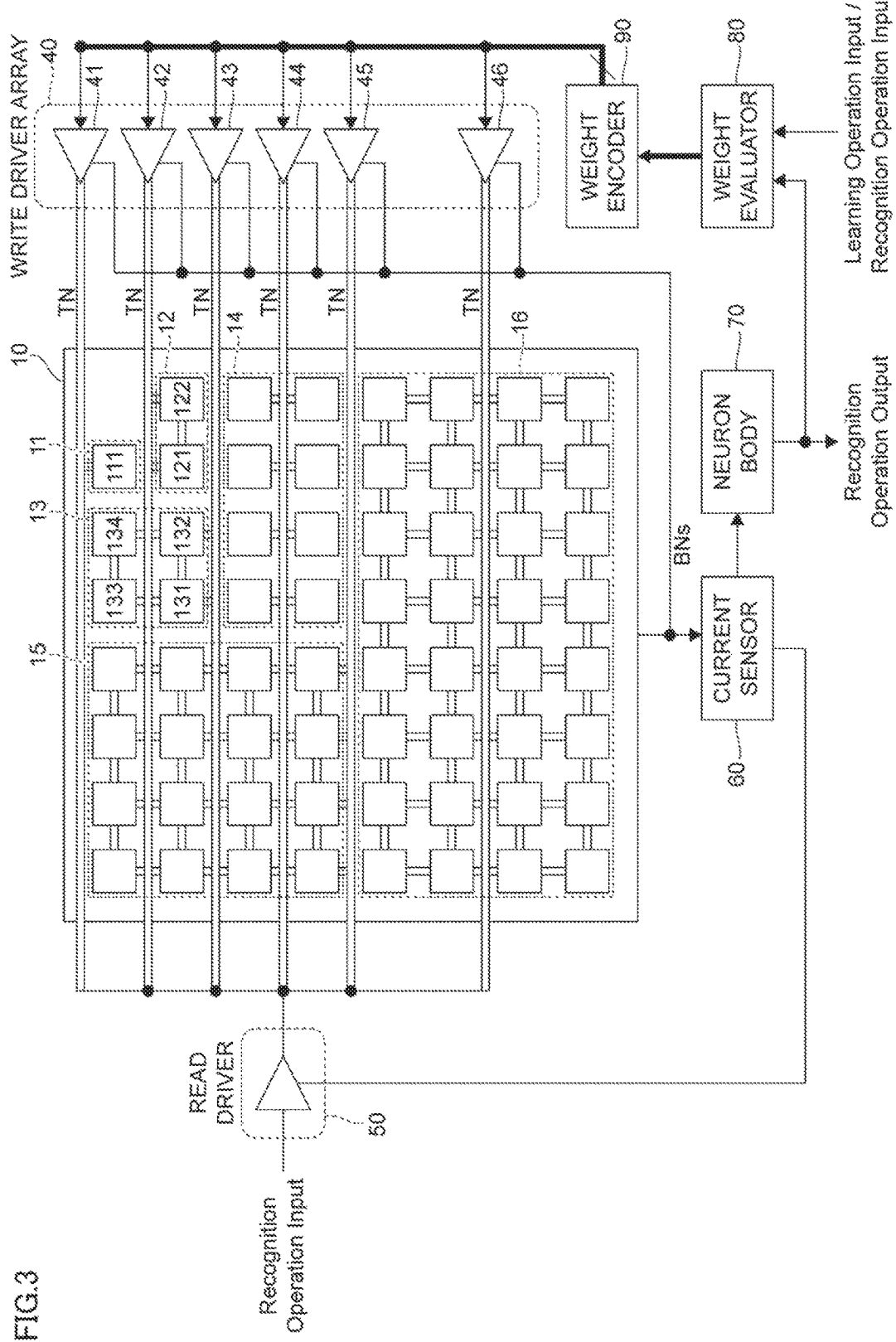
FIG. 3 depicts a synapse memory cell system according to an exemplary embodiment.

Referring to FIG. 3, a synapse memory cell system according to an exemplary embodiment is shown.

FIG. 3 first shows a structure of the synapse memory cell 10 using cell components 11 to 16, which are cell components for i=1 to i=6, respectively. The cell component 11 is assumed to be implemented with 1 (=$2^0$) unit resistance, as shown in FIGS. 2A and 3. The cell component 12 is assumed to be implemented with 2 (=$2^1$) unit resistances, as shown in FIGS. 2B and 3. The cell component 13 is assumed to be implemented with 4 (=$2^2$) unit resistances, as shown in FIGS. 2C and 3. The cell component 14 is assumed to be implemented with 8 (=$2^3$) unit resistances, as shown in FIGS. 2D (i=4) and 3. The cell component 15 is assumed to be implemented with 16 (=$2^4$) unit resistances, as shown in FIGS. 2D (i=5) and 3. The cell component 16 is assumed to be implemented with 32 (=$2^5$) unit resistances, as shown in FIGS. 2D (i=6) and 3. Thus, in FIG. 3, one synapse cell is assumed to be implemented with 63 (=$2^6-1$) unit resistances.

FIG. 3 further shows a write driver array 40, a read driver 50, a current sensor 60, a neuron body 70, a weight evaluator 80, and a weight encoder 90, as structural elements working for the synapse memory cell 10.

The write driver array 40 may be configured to write a synapse weight value to the synapse memory cell 10 in response to a learning operation input or a recognition operation input. Specifically, the write driver array 40 may include write drivers 41 to 46 for the cell components 11 to 16, respectively. The TN of each of the cell components 11 to 16 may be connected via a write line to an output node of a corresponding write driver among the write drivers 41 to 46 in the write driver array 40. Thus, the write drivers 41 to 46 may write a weight value "0" or "1" to all of the unit resistance(s) constituting a corresponding one of the cell components 11 to 16 via a corresponding write line. Further, the BNs of the cell components 11 to 16 may be connected together to DC common nodes of the write drivers 41 to 46.

The read driver 50 may be configured to read a synapse weight value from the synapse memory cell 10 in response to a recognition operation input. The TNs of the cell components 11 to 16 may be connected together to an output node of the read driver 50. Thus, the read driver 50 may apply current to all of the cell components 11 to 16 simultaneously.

The current sensor 60 may also be configured to read a synapse weight value from the synapse memory cell 10. The BNs of the cell components 11 to 16 may be connected together via a read line to the current sensor 60. A DC common node of the read driver 50 may also be connected to the current sensor 60. Thus, the current sensor 60 may sense total current from all of the cell components 11 to 16 via a read line.

The neuron body 70 may perform neuron operations. Specifically, the neuron body 70 may obtain the synapse weight value based on the total current sensed by the current sensor 60. Then, the neuron body 70 may output the synapse weight value as a recognition operation output to another synapse memory system, and to the weight evaluator 80. A cell component may pass large current if a large number of unit resistances of the cell component have a weight value "1". On the other hand, a cell component may pass small current if a large number of unit resistances of the cell component have a weight value "0". Accordingly, the total current sensed by the current sensor 60 may represent the synapse weight value stored in the synapse memory cell 10.

The weight evaluator 80 may evaluate the current synapse weight value with neuron output signal of the neuron body 70 and determine the next synapse weight value. Specifically, the weight evaluator 80 may compare the neuron output signal obtained from the neuron body 70 with a desired output signal given as a learning operation input, and calculate the next synapse weight value with which the current synapse weight value stored in the synapse memory cell 10 is to be updated.

The weight encoder 90 may encode the next synapse weight value calculated by the weight evaluator 80. Specifically, the weight encoder 90 may encode the next synapse weight value into binary encoded values, each of which is to be supplied to a corresponding one of the write drivers 41 to 46, and drive the write drivers 41 to 46 so that each of them can write a corresponding one of the binary encoded values to a corresponding one of the cell components 11 to 16.

Figure 4:
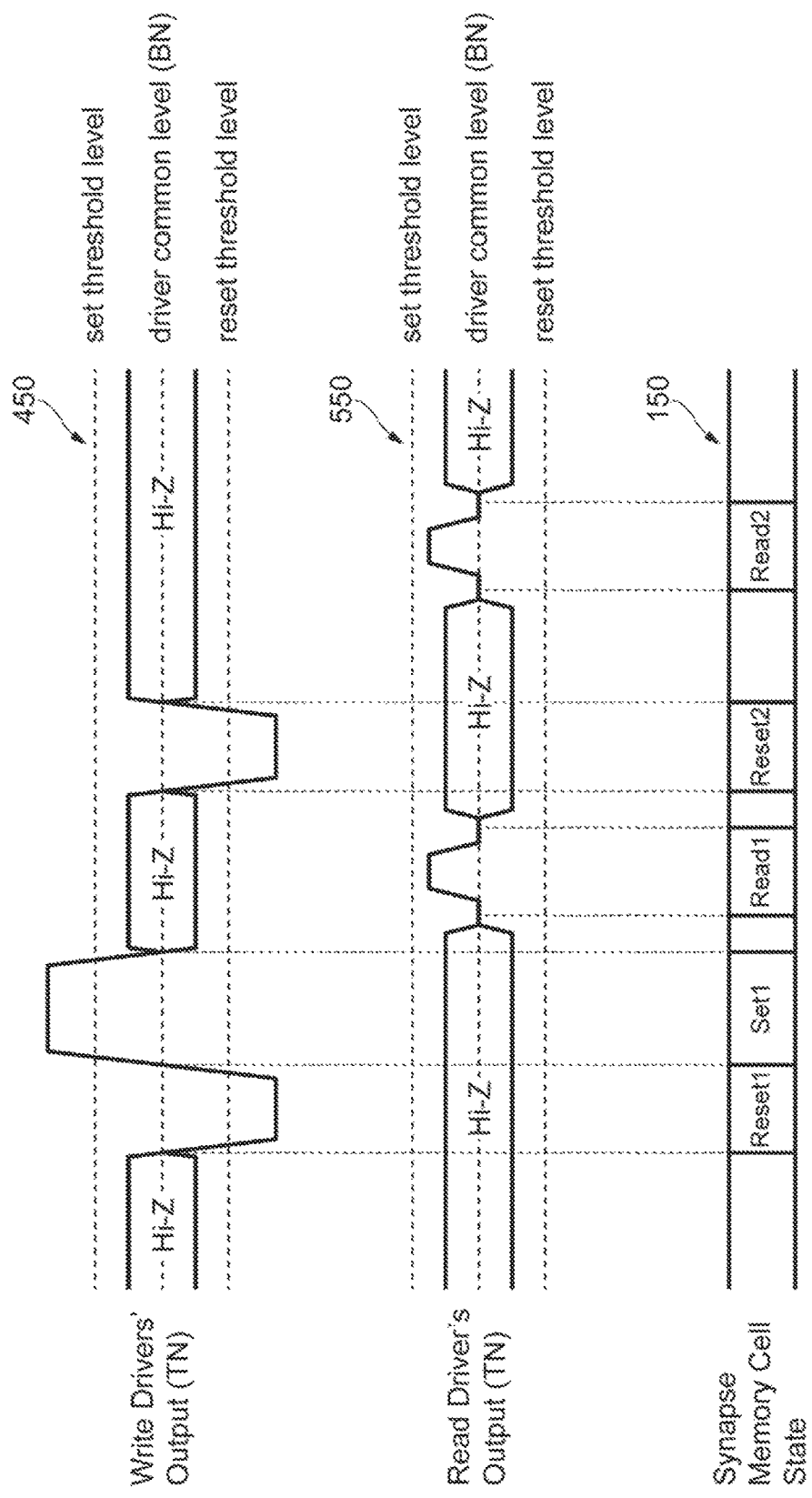
FIG. 4 depicts time charts indicating timings of signal outputs from write drivers, signal outputs from a read driver, and state transitions of the synapse memory cell, according to an embodiment of the present invention.

Referring to FIG. 4, time charts 450, 550, and 150 are shown. The time chart 450 indicates timings of signal outputs from any one of the write drivers 41 to 46 in writing to the synapse memory cell 10. The time chart 550 indicates timings of signal outputs from the read driver 50 in reading from the synapse memory cell 10. Further, the time chart 150 indicates timings of state transitions of the synapse memory cell 10.

To write a synapse weight value to the synapse memory cell 10, each of the write drivers 41 to 46 may be driven to higher or lower than a set or reset threshold level respectively.

First, all of the cell components 11 to 16 are assumed to be pre-set to a light state which gives a weight value "0" by activating all of the write drivers 41 to 46 so that they can drive the cell components 11 to 16 to a reset direction (for example, lower than a reset threshold level). In the time chart 450, this operation is performed at a state "Reset1" of the time chart 150.

Next, only selected cell components among the cell components 11 to 16 is assumed to be set to a heavy state which gives a weight value "1" by activating selected write drivers among the write drivers 41 to 46 so that they can drive the selected cell components to a set direction (for example, higher than a set threshold level). In the time chart 450, this operation is performed at a state "Set1" of the time chart 150.

Next, the selected cell components may be set to a light state which gives a weight value "0" by activating the selected write drivers so that they can drive the selected cell components to a reset direction (for example, lower than a reset threshold level). In the time chart 450, this operation is performed at a state "Reset2" of the time chart 150.

To read a synapse weight value from the synapse memory cell 10, the read driver 50 may be activated. In the time chart 550, this operation is performed at states "Read1" and "Read2" of the time chart 150. At each of the timings, the total current output from all of the cell components 11 to 16, which is proportional to the synapse weight, may be sensed by the current sensor 60.

Note that a level of a signal output from the read driver 50 may be lower than the set threshold level so that the synapse weight value stored in the synapse memory cell 10 is not destroyed (e.g., overwritten) by the signal output from the read driver 50. In the analog cell or the MLC structure, the precise control of the unit resistances is mandatory. However, with this structure, such precise control of the unit resistances may be avoided. This is because all unit resistances are controlled in only two states like the SLC, and neither a verify read nor an additional write is required unlike the MLC.

Further, in order to avoid drive contention, write (reset/set) and read timings may be exclusively separated. That is, the write driver array 40 and the read driver 50 may be controlled not to be activated simultaneously. For example, the write driver array 40 may be kept high impedance (Hi-Z) state while the read driver 50 drives the synapse memory cell 10, and the read driver 50 may be kept high impedance (Hi-Z) state while the write driver array 40 drives the synapse memory cell 10.

Figure 5:
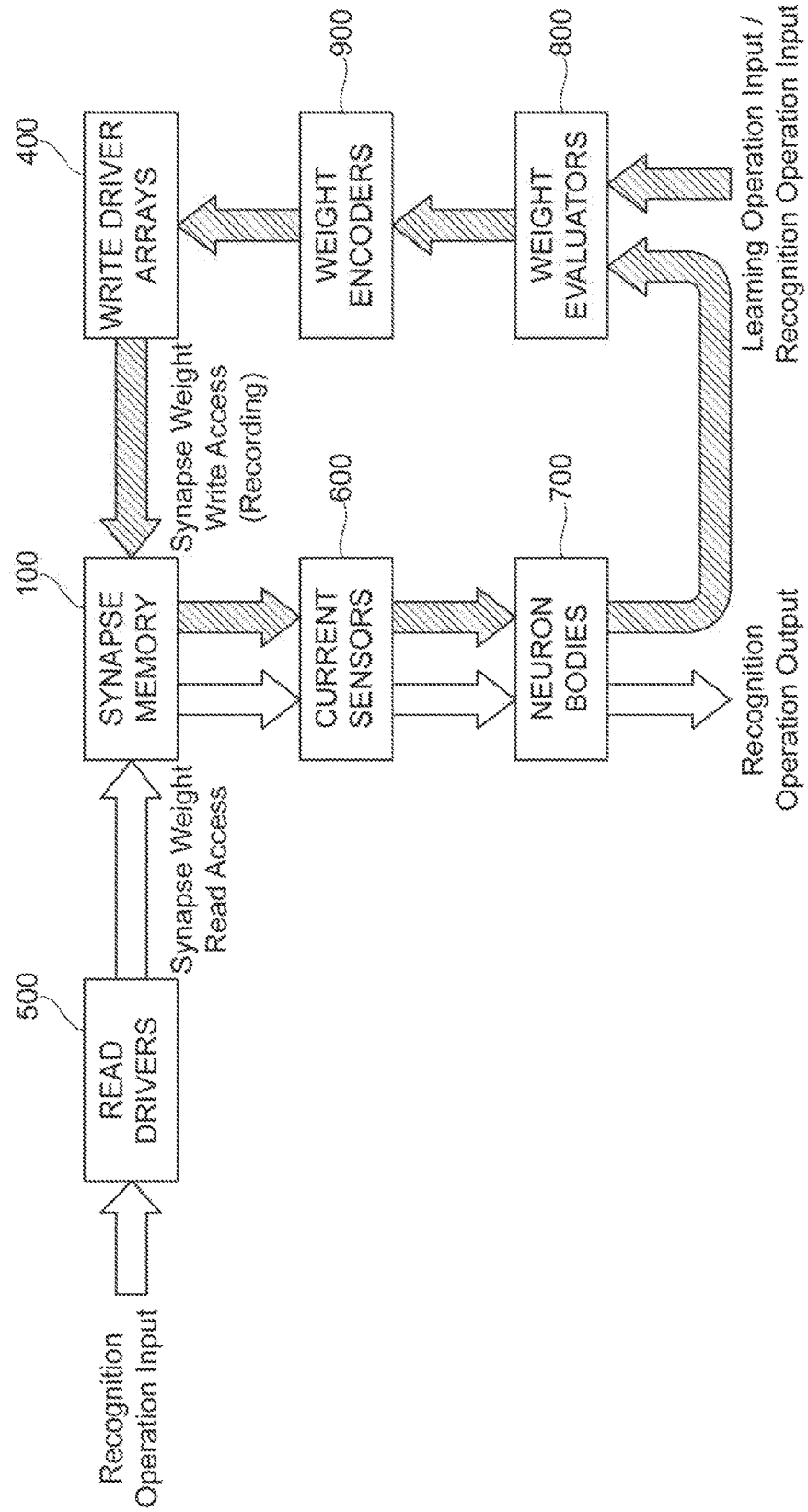
FIG. 5 depicts a synapse memory system and data flows in the synapse memory system according to an exemplary embodiment.

Referring to FIG. 5, an example of a neuro-synaptic core system which includes the synapse memory cell system of FIG. 3 is shown. The data flows in this system according to the exemplary embodiment shown in FIG. 5. In FIG. 5, the synapse memory 100 is assumed to be applied to implement this system with on-line learning.

As shown in FIG. 5, the neuro-synaptic core system may include the synapse memory 100, write driver arrays 400, read drivers 500, current sensors 600, neuron bodies 700, weight evaluators 800, and weight encoders 900.

The synapse memory 100 may include a plurality of synapse memory cells 10, as shown in FIG. 1.

The write driver arrays 400 may include a plurality of write driver arrays, one of which is shown as the write driver array 40 in FIG. 3. Each of the plurality of write driver arrays may be connected to the individual synapse memory cell 10 with the common structure shown in FIG. 3.

The read drivers 500 may include a plurality of read drivers, one of which is shown as the read driver 50 in FIG. 3. Each of the plurality of read drivers may be connected to the individual synapse memory cell 10 with the common structure shown in FIG. 3.

The current sensors 600 may include a plurality of current sensors, one of which is shown as the current sensor 60 in FIG. 3. Each of the current sensors may be connected to the individual synapse memory cells 10 with the common structure shown in FIG. 3.

The neuron bodies 700 may include a plurality of neuron bodies, one of which is shown as the neuron body 70 in FIG. 3. Each of the neuron bodies may be connected to the individual current sensor 60 coupled to the individual memory cells 10 with the common structure shown in FIG. 3.

The weight evaluators 800 may include a plurality of weight evaluators, one of which is shown as the weight evaluator 80 in FIG. 3. Each of the weight evaluators may be connected to the individual weight encoder 90 coupled to the individual synapse memory cell 10 through the individual write driver array 40 with the common structure shown in FIG. 3.

The weight encoders 900 may include a plurality of weight encoders, one of which is shown as the weight encoder 90 in FIG. 3. Each of the weight encoders may be connected to the individual write driver array 40 coupled to the individual synapse memory cell 10 with the common structure shown in FIG. 3.

FIG. 5 further shows a data flow in a learning operation mode indicated by hatched arrows and a data flow in a recognition operation mode indicated by outlined arrows.

In the learning operation mode, as shown in FIG. 5, one of the write driver arrays 400 may apply voltage to a corresponding synapse memory cell 10 in the synapse memory 100 in response to a recognition operation input. In this case, if one of the write driver arrays 400 applies a voltage whose level is between the reset threshold level and the set threshold level of FIG. 4, it does not overwrite a synapse weight value stored in the synapse memory cell 10.

Then, one of the current sensors 600 may sense total current from a corresponding dendrite 30 coupled to the synapse memory cell 10. One of the neuron bodies 700 may calculate neuron membrane potential value based on the total current sensed by one of the current sensors 600, and supply neuron output to one of the weight evaluators 800. One of the weight evaluators 800 may compare the neuron output obtained from one of the neuron bodies 700 with a learning operation input, and calculate the next synapse weight value which is used to update the contents of synapse memory cell 10, based on a result of the comparison. One of the weight encoders 900 may encode the next synapse weight value into binary encoded values, and drive one of the write driver arrays 400 so that it can write the binary encoded values to the synapse memory cell 10. One of the write driver arrays 400 may drive the binary encoded values to the synapse memory cell 10 as a synapse weight value.

In the recognition operation mode, as shown in FIG. 5, the read drivers 500 may apply current to the axons 20 coupled to the synapse memory cells 10 in the synapse memory 100 in response to a recognition operation input.

Then, the current sensors 600 may sense total current from the dendrites 30 coupled to the synapse memory cells 10. The neuron bodies 700 may calculate neuron membrane potential based on the total current sensed by the current sensors 600, and supply neuron output to another synapse memory system as a recognition operation output.

Figure 6:
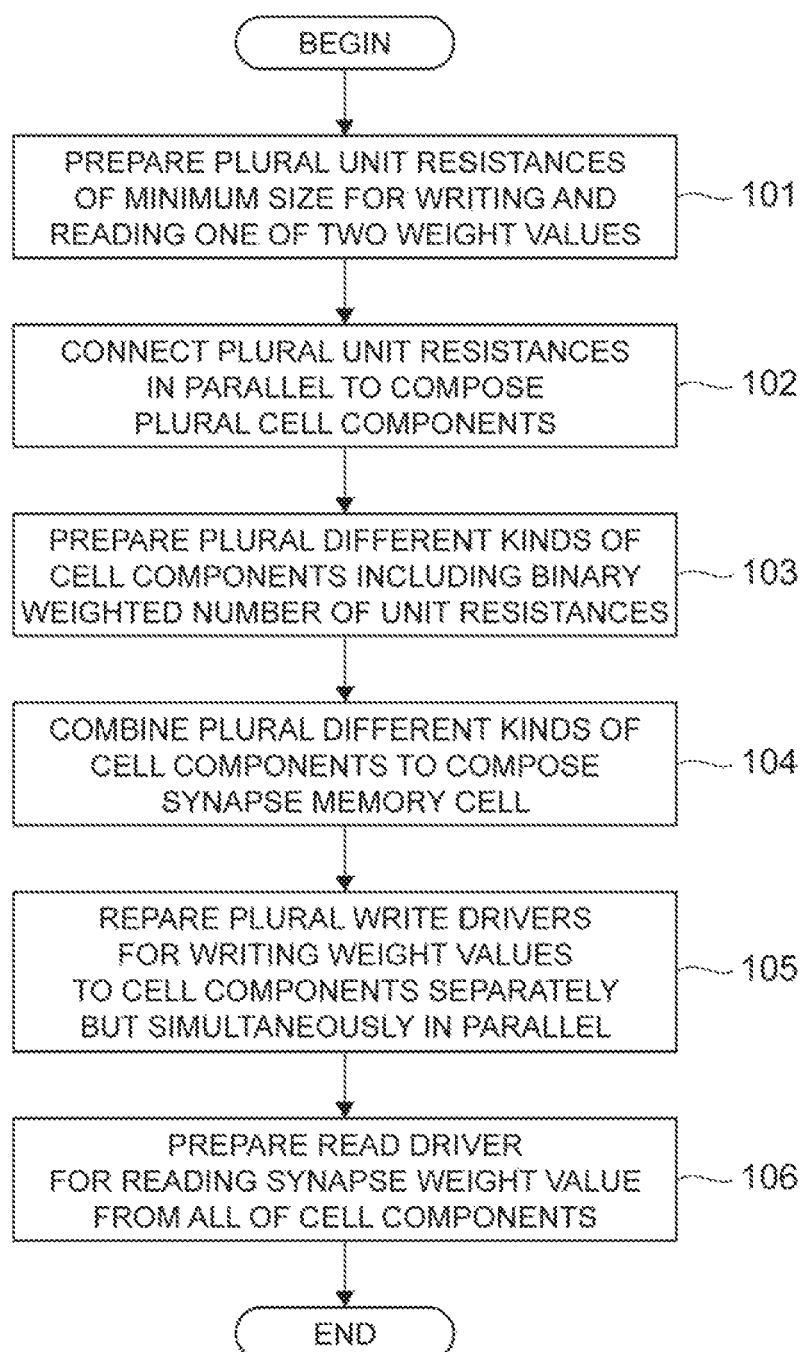
FIG. 6 depicts a block/flow diagram representing a method for fabricating a synapse memory cell system, according to an exemplary embodiment.

Referring to FIG. 6, a block/flow diagram is shown representing a fabrication procedure of the synapse memory cell system including write and read drivers according to an embodiment.

As shown in FIG. 6, a plurality of unit resistances of the minimum size for writing and reading one of two weight values may be prepared (step 101). For example, the two weight values may be a weight value "1" corresponding to a heavy state and a weight value "0" corresponding to a light state. The plurality of unit resistances may be connected in parallel to compose the plurality of cell components (step 102). Next, different kinds of cell components 11 to 16 including a binary weighted number of the unit resistances may be prepared (step 103). The different kinds of cell components 11 to 16 may be combined to compose the synapse memory cell 10 (step 104).

Meanwhile, the write drivers 41 to 46 for writing weight values to the cell components 11 to 16 in the synapse memory cell 10 separately but simultaneously in parallel may be prepared (step 105). That is, the write drivers 41 to 46 for digital writing may be prepared. This step may further include arranging write lines used for such digital writing. The read driver 50 for reading a synapse weight value from the cell components 11 to 16 simultaneously in the synapse memory cell 10 may be prepared (step 106). That is, the read driver 50 for analog reading may be prepared. This step may further include arranging a read line used for such analog reading.

Next, an alternative exemplary embodiment will be described.

In an alternative exemplary embodiment, the synapse memory cell 10 is assumed to be a capacitive memory cell which includes a plurality of unit capacitors. The resistive memory cell in the exemplary embodiment may be replaced with the capacitive memory cell because a synapse weight value may be expressed both by a conductance value of the resistive memory cell and by a capacitance value of the capacitive memory cell in the same way. The capacitance value of the capacitive memory cell may be doubled when the unit capacitors are connected in parallel and halved when the unit capacitors are connected in series, as with the conductance value of the resistive memory cell. Note that, in the alternative exemplary embodiment, the current sensor 60 (e.g., the current sensors 600) may also be replaced with a capacitance sensor (e.g., capacitance sensors) and the like. Further, the capacitance value of the capacitive memory cell may be generalized to a state of unit cells as the conductance value of the resistive memory cell may be done for the resistive memory cell.

Subsequently, another alternative exemplary embodiment will be described.

In the second alternative exemplary embodiment, the weight value $W_{unit}$ is assumed to have three states, namely a heavy state, a middle state, and a light state. For example, the weight value $W_{unit}$ may be two when it has a heavy state, one when it has a middle state, and zero when it has a light state.

In the second alternative exemplary embodiment, cell components each consisting of $3^{i-1}$ unit resistances may be prepared, where i is 1 to n. If i is not 1, the $3^{i-1}$ unit resistances may be connected in parallel. Thus, the cell component consisting of the $3^{i-1}$ unit resistances may have a weight value expressed with $3^{i-1}$ times of $W_{unit}$ (a resistance value expressed with one $3^{i-1}$th ($1/3^{i-1}$) of $R_{unit}$). That is, the cell component consisting of the $3^{i-1}$ unit resistances may have a weight value "0", "$3^{i-1}$", or "$2 \times 3^{i-1}$".

For example, a cell component for i=1 may have a weight value "0", "1", or "2". The weight values "0", "1" and "2" serve as one example of a first set of a predetermined number of states. For the single cell component for i=1, the weight values "0", "1" and "2" also serve as one example of a second set of a predetermined number of states. A cell component for i=2 may have a weight value "0", "3", or "6". The weight values "0", "3", and "6" serve as one example of a first set of a predetermined number of states. A cell component for i=3 may have a weight value "0", "9", or "18". The weight values "0", "9", and "18" serve as one example of a first set of a predetermined number of states. By combining these cell components for i=1 to i=3, for example, the synapse weight values "0" to "26" can be expressed. That is, with these cell components for i=1 to i=n, the synapse weight values for n-digit ternary numbers can be expressed.

What is claimed is:

1. A memory cell structure comprising:
    a synapse memory cell including a plurality of cell components, each of the plurality of cell components including at least one unit cell;
    a plurality of write lines configured to write a synapse state to the synapse memory cell, each of the plurality of write lines being configured to write the synapse state by writing a first set of states to a corresponding cell component of the plurality of cell components by writing a second set of states to each unit cell included in the corresponding cell component, the first and second sets each having a predetermined number of states, and the first set being dependent on the second set and a number of unit cells included in the corresponding cell component; and
    a read line configured to read the synapse state from the synapse memory cell, the read line being configured to read the synapse state by reading the first set of states from all of the plurality of cell components simultaneously.

2. The memory cell structure of claim 1, wherein each of the at least one unit cell is a resistance and the first and second sets of states include states regarding conductance of the resistance.

3. The memory cell structure of claim 1, wherein each of the at least one unit cell is a capacitor and the first and second sets of states include states regarding capacitance of the capacitor.

4. The memory cell structure of claim 1, wherein:
    the predetermined number of states is two;
    an i-th cell component of the plurality of cell components includes $2^{i-1}$ unit cells, where i is a natural number; and
    each of the states in the first set is $2^{i-1}$ times of a corresponding one of the states in the second set.

5. The memory cell structure of claim 1, wherein:
    the predetermined number of states is three;
    an i-th cell component of the plurality of cell components includes $3^{i-1}$ unit cells, where i is a natural number; and
    each of the states in the first set is $3^{i-1}$ times of a corresponding one of the states in the second set.

6. A memory cell system comprising:
    a synapse memory cell including a plurality of cell components, each of the plurality of cell components including at least one unit cell;
    a plurality of write drivers configured to write a synapse state to the synapse memory cell, each of the plurality of write drivers being configured to write the synapse state by writing a first set of states to a corresponding cell component of the plurality of cell components by writing a second set of states to each unit cell included in the corresponding cell component, the first and second sets each having a predetermined number of states, and the first set being dependent on the second set and a number of unit cells included in the corresponding cell component; and
    a read driver configured to read the synapse state from the synapse memory cell, the read line being configured to read the synapse state by reading the first set of states from all of the plurality of cell components simultaneously.

7. The memory cell system of claim 6, wherein each of the at least one unit cell is a resistance and the first and second sets of states include states regarding conductance of the resistance.

8. The memory cell system of claim 6, wherein each of the at least one unit cell is a capacitor and the first and second sets of states include states regarding capacitance of the capacitor.

9. The memory cell system of claim 6, wherein:
    the predetermined number of states is two;
    an i-th cell component of the plurality of cell components includes $2^{i-1}$ unit cells, where i is a natural number; and
    each of the states in the first set is $2^{i-1}$ times of a corresponding one of the states in the second set.

10. The memory cell system of claim 6, wherein:
    the predetermined number of states is three;
    an i-th cell component of the plurality of cell components includes $3^{i-1}$ unit cells, where i is a natural number; and
    each of the states in the first set is $3^{i-1}$ times of a corresponding one of the states in the second set.

11. A method for fabricating a memory cell structure, the method comprising:
    preparing a plurality of unit cells;
    composing a plurality of cell components, each of the plurality of cell components including at least one unit cell of the plurality of unit cells;
    composing a synapse memory cell which includes the plurality of cell components;
    arranging a plurality of write lines configured to write a synapse state to the synapse memory cell, each of the plurality of write lines being configured to write the synapse state by writing a first set of states to a corresponding cell component of the plurality of cell components by writing a second set of states to each unit cell included in the corresponding cell component, the first and second sets each having a predetermined number of states, and the first set being dependent on the second set and a number of unit cells included in the corresponding cell component; and
    arranging a read line configured to read the synapse state from the synapse memory cell, the read line being configured to read the synapse state by reading the first set of the predetermined number of states from all of the plurality of cell components simultaneously.

12. The method of claim 11, wherein each of the at least one unit cell is a resistance and the first and second sets of states include states regarding conductance of the resistance.

13. The method of claim 11, wherein each of the at least one unit cell is a capacitor and the first and second sets of states include states regarding capacitance of the capacitor.

14. The method of claim 11, wherein:
    the predetermined number of states is two;
    an i-th cell component of the plurality of cell components includes $2^{i-1}$ unit cells, where i is a natural number; and
    each of the states in the first set is $2^{i-1}$ times of a corresponding one of the states in the second set.

15. The method of claim 11, wherein:
    the predetermined number of states is three;
    an i-th cell component of the plurality of cell components includes $3^{i-1}$ unit cells, where i is a natural number; and each of the states in the first set is $3^{i-1}$ times of a corresponding one of the states in the second set.

16. The method of claim 11, wherein:

the predetermined number of states is n, where n is a natural number greater than one;

an i-th cell component of the plurality of cell components that includes $n^{i-1}$ unit cells, where i is a natural number; and each of the states in the first set is $n^{i-1}$ times of a corresponding one of the states in the second set.

17. The memory cell structure of claim 1, wherein:

the predetermined number of states is n, where n is a natural number greater than one;

an i-th cell component of the plurality of cell components that includes $n^{i-1}$ unit cells, where i is a natural number; and each of the states in the first set is $n^{i-1}$ times of a corresponding one of the states in the second set.

18. The memory cell system of claim 6, wherein:

the predetermined number of states is n, where n is a natural number greater than one;

an i-th cell component of the plurality of cell components that includes $n^{i-1}$ unit cells, where i is a natural number; and each of the states in the first set is $n^{i-1}$ times of a corresponding one of the states in the second set.

\* \* \* \* \*